United States Patent
He

(10) Patent No.: US 11,322,187 B2
(45) Date of Patent: May 3, 2022

(54) PROTECTION CIRCUIT FOR MEMORY IN DISPLAY PANEL AND DISPLAY PANEL

(71) Applicant: HKC Corporation Limited, Guangdong (CN)

(72) Inventor: Huailiang He, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 530 days.

(21) Appl. No.: 16/398,307

(22) Filed: Apr. 30, 2019

(65) Prior Publication Data

US 2020/0143860 A1 May 7, 2020

Related U.S. Application Data

(63) Continuation of application No. PCT/CN2018/121831, filed on Dec. 18, 2018.

(30) Foreign Application Priority Data

Nov. 6, 2018 (CN) .......................... 201811317750.6

(51) Int. Cl.
| | | |
|---|---|---|
| *G11C 7/24* | (2006.01) | |
| *G11C 11/40* | (2006.01) | |
| *G11C 7/22* | (2006.01) | |
| *G11C 5/14* | (2006.01) | |

(52) U.S. Cl.
CPC ................ *G11C 7/24* (2013.01); *G11C 5/148* (2013.01); *G11C 7/22* (2013.01); *G11C 11/40* (2013.01)

(58) Field of Classification Search
CPC .. G11C 7/24; G11C 5/148; G11C 7/22; G11C 11/40; G11C 16/22
See application file for complete search history.

(56) References Cited

U.S. PATENT DOCUMENTS

| | | | |
|---|---|---|---|
| 10,755,789 B1* | 8/2020 | Kao | .......................... G11C 7/24 |
| 2010/0265785 A1* | 10/2010 | Lee | ....................... G11C 16/225 |
| | | | 365/229 |
| 2018/0151240 A1 | 5/2018 | Zhou et al. | |
| 2021/0020212 A1* | 1/2021 | He | ............................ G09G 3/20 |
| 2021/0335300 A1* | 10/2021 | Wu | ....................... G09G 3/3648 |

FOREIGN PATENT DOCUMENTS

| | | |
|---|---|---|
| CN | 2390261 Y | 8/2000 |
| CN | 2678275 Y | 2/2005 |
| CN | 101089997 A | 12/2007 |
| CN | 106098092 A | 11/2016 |
| CN | 107526979 A | 12/2017 |

* cited by examiner

*Primary Examiner* — Jay W. Radke

(57) ABSTRACT

The present application discloses a protection circuit for a memory in a display panel and a display panel. The circuit comprises a timing controller, a memory, a power circuit, and a switching circuit. Instead of having a computer provide a write protection signal to the memory to limit data in the memory from being overwritten, the power circuit provides a stable and reliable write protection signal to the memory, and then the timing controller controls the switching circuit to be turned on for grounding the write protection signal of the memory only when an instruction to write data to the memory is received.

19 Claims, 3 Drawing Sheets

US 11,322,187 B2

PROTECTION CIRCUIT FOR MEMORY IN DISPLAY PANEL AND DISPLAY PANEL

CROSS REFERENCE TO RELATED APPLICATIONS

This application is a Continuation Application of PCT Application No. PCT/CN2018/121831 filed on Dec. 18, 2018, which claims the benefit of Chinese patent application No. 201811317750.6 titled "PROTECTION CIRCUIT FOR A MEMORY IN DISPLAY PANEL AND A DISPLAY PANEL" applied on Nov. 6, 2018, the disclosure of which is incorporated herein by reference in its entirety.

FIELD OF THE DISCLOSURE

The present disclosure relates to the field of display panel technologies, in particular, to a protection circuit for a memory in display panel and a display panel.

BACKGROUND OF THE DISCLOSURE

In a display panel connected to a computer, a timing controller and a memory are connected to each other through a serial communication unit such as an I2C bus for data transmission. At the time of power-on, the timing controller internally reads software data of the timing controller (data for the timing controller) stored in the memory (e.g., output enable signal OE, latch signal TP, frame start signal STV, polarity inversion signal POL) through the serial communication unit to complete the initialization setting of the timing controller, and then control the display panel driving circuit to drive the display panel to operate. Among them, the read and write of the timing controller is controlled by a signal WP provided by the computer. WP is a write protection signal of the memory. When WP is high, the read operation is performed, and when WP is low, the read and write operations are performed. The memory should be in a write protection state under normal state, that is, WP always has to be at a high level H in the normal state.

However, the problem that is more likely to occur now is that the software data has been typically written to memory in the production facility after the circuit board PCBA complete production. Then in the panel factory, after the binding point is completed, the power-on test is performed. At this time, since WP is high, the read operation is performed, but once the WP is disturbed and pulled to be low, the read and write operations will be performed. Then, if the read/write bit on the SDA data line is write when the memory performs recognition due to the line length and high frequency, etc., the software data in the memory is overwritten. When the timing controller reads the software data that are overwritten, a reading error may occur, so that the initialization setting of the timing controller cannot be completed, or an abnormality when driving the display panel may even occur.

SUMMARY OF THE DISCLOSURE

The main purpose of the present application is to provide a protection circuit for a memory in a display panel, which aims to reduce the probability of software data being overwritten in the display panel.

To achieve the foregoing purpose, the present disclosure provides a write protection circuit for a memory in a display panel, which comprises:

a timing controller having a signal transmission end and a write control signal output end;

a memory having a signal transmission end and a write protection signal control end, the signal transmission end of the memory being connected to the signal transmission end of the timing controller; the memory is configured to store software data of the timing controller;

a power circuit, an output end of which being connected to the write protection signal control end, the power circuit being configured to output a write protection signal to the memory to limit data of the memory from being overwritten; and a switching circuit, an input end of which is interconnected with the output end of the power circuit and the write protection signal control end, an output end of the switching circuit being grounded, a controlled end of the switching circuit being connected to the write control signal output end;

the timing controller is configured to control the switching circuit to be in a normally turn-off state, and control the switching circuit to be turned on when (in response to) receiving a data write instruction to the memory.

In an embodiment, the switching circuit includes a switch transistor; the switch transistor has a first connection end, a second connection end, and a controlled end; the first connection end of the switch transistor is the input end of the switching circuit, the second connection end is the output end of the switching circuit, and the controlled end of the switch transistor is the controlled end of the switching circuit.

In an embodiment, the switch transistor is a P-type MOS transistor; a source of the P-type MOS transistor is the first connection end of the switch transistor, a drain of the P-type MOS transistor is the second connection end of the switch transistor, and a gate of the P-type MOS transistor is the controlled end of the switch transistor.

In an embodiment, the switch transistor is a N-type MOS transistor; a drain of the N-type MOS transistor is the first connection end of the switch transistor, a source of the N-type MOS transistor is the second connection end of the switch transistor, and a gate of the N-type MOS transistor is the controlled end of the switch transistor.

In an embodiment, the protection circuit for a memory in display panel further includes a first resistor; the first end of the first resistor is connected to the output end of the power circuit, and the second end of the first resistor is connected to the input end of the switching circuit and a common end of the write protection signal control end.

In an embodiment, the timing controller is further configured to control the switching circuit to be turned off when receiving a feedback signal after the memory completes data writing.

In an embodiment, the memory is an electrically erasable programmable read only memory.

To achieve the foregoing purpose, the present disclosure further provides a write protection circuit for a memory in display panel, which comprises:

a timing controller having a signal transmission end and a write control signal output end;

a memory having a power end, a signal transmission end and a write protection signal control end, the signal transmission end of the memory being connected to the signal transmission end of the timing controller; the memory is configured to store software data of the timing controller;

a power circuit, an output end of which being connected to the write protection signal control end, the power circuit being further connected to the power end of the memory; the power circuit is configured to output a write protection signal to the memory to limit data of the memory from being overwritten; and a switching circuit, an input end of which is interconnected with the output end of the power circuit and the write protection signal control end, an output end of the switching circuit being grounded, a controlled end of the switching circuit being connected to the write control signal output end;

the timing controller is configured to control the switching circuit to be in a normally turn-off state, and control the switching circuit to be turned on when receiving a data write instruction to the memory.

To achieve the foregoing purpose, the present disclosure further provides a display panel, which comprises the above write protection circuit for a memory in the display panel including:

a timing controller having a signal transmission end and a write control signal output end;

a memory having a signal transmission end and a write protection signal control end, the signal transmission end of the memory being connected to the signal transmission end of the timing controller; the memory is configured to store software data of the timing controller;

a power circuit, an output end of which being connected to the write protection signal control end, the power circuit being configured to output a write protection signal to the memory to limit data of the memory from being overwritten; and a switching circuit, an input end of which is interconnected with the output end of the power circuit and the write protection signal control end, an output end of the switching circuit being grounded, a controlled end of the switching circuit being connected to the write control signal output end;

the timing controller is configured to control the switching circuit to be in a normally turn-off state, and control the switching circuit to be turned on when receiving a data write instruction to the memory.

In an embodiment, the memory also has a power end, and the power circuit is further connected to the power end of the memory.

In an embodiment, the switching circuit includes a switch transistor; the switch transistor has a first connection end, a second connection end, and a controlled end; the first connection end of the switch transistor is the input end of the switching circuit, the second connection end is the output end of the switching circuit, and the controlled end of the switch transistor is the controlled end of the switching circuit.

In an embodiment, the switch transistor is a P-type MOS transistor; a source of the P-type MOS transistor is the first connection end of the switch transistor, a drain of the P-type MOS transistor is the second connection end of the switch transistor, and a gate of the P-type MOS transistor is the controlled end of the switch transistor.

In an embodiment, the switch transistor is a N-type MOS transistor; a drain of the N-type MOS transistor is the first connection end of the switch transistor, a source of the N-type MOS transistor is the second connection end of the switch transistor, and a gate of the N-type MOS transistor is the controlled end of the switch transistor.

In an embodiment, the protection circuit for a memory in display panel further includes a first resistor; the first end of the first resistor is connected to the output end of the power circuit, and the second end of the first resistor is connected to the input end of the switching circuit and a common end of the write protection signal control end.

In an embodiment, the timing controller is further configured to control the switching circuit to be turned off when receiving a feedback signal after the memory completes data writing.

In an embodiment, the memory is an electrically erasable programmable read only memory.

In an embodiment, the power circuit is a DC power source.

In an embodiment, the display panel is a liquid crystal display panel or an organic light emitting diode display panel or a field emitting display panel or a plasma display panel or a curved surface panel.

In the technical solution of the present application, by disposing a timing controller, a memory, a power circuit, and a switching circuit to constitute a write protection circuit for a memory in a display panel, in the circuit, a prior art write protection signal is no longer provided since now the power circuit outputs a write protection signal to the memory to limit the memory data from being overwritten; the timing controller controls the switching circuit to be turned off, and controls the switching circuit to be turned on only when (in response to) receiving an instruction to write data to the memory; then, when the switching circuit is turned off, the write protection signal is output to the write protection signal control end of the memory, and when the switching circuit is turned on, the write protection signal control terminal of the memory is grounded. Since the write protection signal is output by the power circuit, the signal is stable and reliable, and is not easily affected (disturbed) by other circuits, the software data in the memory may not be overwritten even if the read/write bit on the SDA data line is write during memory recognition due to line length and high frequency, etc., so the purpose of reducing the probability of software data being overwritten in the memory is achieved.

BRIEF DESCRIPTION OF THE DRAWINGS

In order to illustrate the technical schemes in the embodiments of the present disclosure or in the prior art more clearly, the drawings which are required to be used in the description of the embodiments of the present disclosure or the prior art are briefly described below. It is obvious that the drawings described below are only some embodiments of the present disclosure. It is apparent to those of ordinary skill in the art that other drawings may be obtained based on the structures shown in accompanying drawings without inventive effort.

Figure 1:
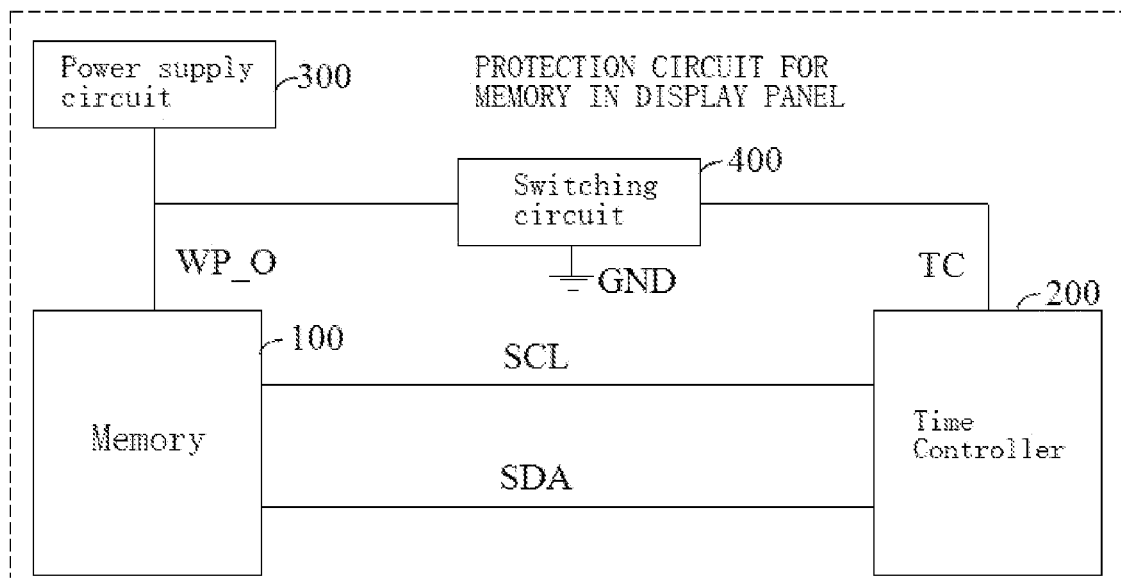
FIG. 1 is a circuit function block view of an embodiment of a protection circuit for a memory in display panel of the present application.

The object realization, function characteristics and advantages of this application will be further described in reference to embodiments and accompanying drawings.

DETAILED DESCRIPTION OF THE EMBODIMENTS

The technical solutions in the embodiments of the present application will be clearly and completely described here-after in reference to the drawings in the embodiments of the present application. It is apparent that the described embodiments are merely a part of embodiments rather than all the embodiments of the present application. All the other embodiments obtained by the artisans concerned on the basis of the embodiments in the present application without creative efforts fall within the scope of claims of the present application.

It should be noted that all directional indications (such as up, down, left, right, front, back, . . . ) in the embodiments of the present application are only used to explain the relative positional relationship, motion situation and the like between components in a certain posture (as shown in the drawings), if the specific posture changes, the directional indication shall also change accordingly.

In addition, the descriptions of "first", "second" and the like in the present application are used for the purpose of description only, and are not to be construed as indicating or implying their relative importance or implicitly indicating the number of technical features indicated. Therefore, the characteristics indicated by the "first", the "second" can express or impliedly include at least one of the characteristics. In addition, technical schemes of different embodiments can be combined with each other, however the technical solutions must base on that persons of ordinary skill in the art can realize the technical solutions, when the combination of the technical solutions occurs contradiction or cannot realize, it should consider that the combination of the technical solutions is impractical, and is not contained in the protection scope required by the present disclosure.

In a prior art display panel connected to a computer, the timing controller and the memory are connected to each other through a serial communication unit such as an I2C bus (including SDA data line and SCL clock line) for data transmission. At the time of power-on, the timing controller internally reads the software data of the timing controller stored in the memory (e.g., output enable signal OE, latch signal TP, frame start signal STV, polarity inversion signal POL) through the serial communication unit to complete the initialization setting of the timing controller. Among them, the read and write of the memory is controlled by a signal WP provided by the computer. WP is a write protection signal of the memory. When WP is high, the read operation is performed, and when WP is low, the read and write operations are performed. The memory should be in a write protection state under normal state, that is, WP always has to be at a high level H in the normal state. However, the problem that is more likely to occur now is that the software data has been typically written to memory in the production facility after the circuit board PCBA complete production. Then in the panel factory, after the binding point is completed, the power-on test is performed. At this time, since WP is high, the read operation is performed, but once the WP is disturbed and pulled to be low, the read and write operations will be performed. Then, if the read/write bit on the SDA data line is write when the memory performs recognition due to the line length and high frequency, etc., the software data in the memory is overwritten. When the timing controller reads the software data that are overwritten, a reading error may occur, so that the initialization setting of the timing controller cannot be completed. As a result, various control signals for driving the display panel may not be correctly output, resulting in abnormal display screens and frequent errors. However, there is no error correction mechanism in this prior art display panel so this may not be prevented.

In view of the above problems, the present application provides a protection circuit for a memory in display panel. Referring to FIG. 1, in an embodiment of the present application, the protection circuit for a memory in display panel comprises a memory 100, a timing controller 200, a power circuit 300 and a switching circuit 400.

The timing controller 200 has a signal transmission end and a write control signal output end, and the memory 100 has a signal transmission end and a write protection signal control end; the signal transmission end of the memory 100 is connected to the signal transmission end of the timing controller 200; an output end of the power circuit 300 is connected to the write protection signal control end, an output end of the switching circuit 400 is interconnected to the output end of the power circuit 300 and the write protection signal control end, the output end of the switching circuit 400 is grounded, and a controlled end of the switching circuit 400 is connected to the write control signal output end.

In the present embodiment, the memory 100 may be an electrically erasable programmable read only memory EEPROM that may store data after power down to prevent data loss. The memory 100 is configured to store software data of the timing controller 200. While in the read state, the timing controller 200 may read the software data of the memory 100 and complete the corresponding initialization settings. After the timing controller 200 completes the corresponding initialization setting, various control signals may be output to drive the display panel to operate.

In the present embodiment, the power circuit 300 may be a DC power source or a DC power source obtained by converting a power source after AC power source is accessed. The power circuit 300 is configured to output a write protection signal WP_O to the memory 100 to limit the data of the memory 100 from being overwritten. Among them, the write protection signal WP_O is in principle a high level signal, so that the input signal of the write protection signal control end of the memory 100 is always high. Correspondingly, WP is always high, so that the memory 100 is always in the write protection state without being written with the data, so that the software data in the memory 100 may be prevented from being overwritten.

In the present embodiment, the switching circuit 400 has two states of turn-off and turn-on, which may be implemented by using circuits composed of various transistors, such as a MOS transistor, a triode, and other composite switching circuits 400 composed of a plurality of transistors. Among them, when the switching circuit 400 is turned off, the power circuit 300 outputs a write protection signal to the write protection signal control end of the memory 100; when the switching circuit 400 is turned on, the write protection signal control of the memory 100 is grounded.

In the present embodiment, the timing controller 200 is configured to control the switching circuit 400 to be in a normally turn-off state, and control the switching circuit 400 to be turned on when receiving a data write instruction to the memory 100.

When the switching circuit 400 is in the normally turn-off state, the power circuit 300 outputs the write protection signal WP_O to the write protection signal control end of the memory 100 to limit the memory 100 to be written with data, that is, the original write protection signal WP of the prior art is not present, and this signal WP_O is equivalent to the original write protection signal WP. Since this signal WP_O is output by the power circuit 300, is stable and reliable, and is not easily affected by other circuits, the software data in the memory 100 may not be overwritten due to protection of the write protection signal WP_O even if the read/write bit on the SDA data line is write during memory 100 recognition due to line length and high frequency, etc., so the purpose of reducing the probability of software data being overwritten in the memory 100 is achieved, and the circuit in which the switching circuit 400 is used for switching control is simple in structure and easy to implement. In addition, it is understood that since the data of the memory 100 may not be overwritten, the reject rate is lowered, and thus the production yield may be increased.

Further, the memory 100 also has a power end, and the power circuit 300 is further connected to the power end of the memory 100. In the present embodiment, the memory 100 is powered by the power circuit 300, and the operating voltage may be 3.3 volts, and when the WP_O is high, it is also 3.3V. Thus, power supply and write protection control for the memory 100 may be achieved with only one power supply, and even if the power supply fails and the power is turned off, which causes the write protection signal WP_O output to the memory 100 to fail, the memory 100 also stops operating due to power loss. At this time, it is impossible to write data to the memory 100 regardless of the method used. In this way, the data of the memory 100 is reliably protected from being overwritten, thereby improving the anti-interference ability of the display panel.

In an embodiment, the switching circuit 400 is implemented by the following circuit structure: the switching circuit 400 includes a switch transistor; the switch transistor has a first connection end, a second connection end, and a controlled end; the first connection end of the switch transistor is the input end of the switching circuit 400, the second connection end is the output end of the switching circuit 400, and the controlled end of the switch transistor is the controlled end of the switching circuit 400.

In the present embodiment, the turn-on and turn-off of the switch transistor are controlled by the high level and low level signals output by the timing controller 200. If the switch transistor is selected to be turned off when receiving a high level signal, and turned on when a low level signal is received, here, the timing controller 200 outputs a high level signal in a normal state, so that the switch transistor is in an turn-off state, and the high level signal output by the power circuit 300 is given to the write protection signal control end of the memory 100, so that the memory 100 is in a write protection state; while the data is to be written to the memory 100, the timing controller 200 outputs a low level signal to control the switch transistor to be turned on, and pulls down the signal level of the write protection signal control end of the memory 100 for removing or releasing the write protection state of the memory 100. If the switch transistor is selected to be turned off when receiving a low level signal, and turned on when a high level signal is received, here, the timing controller 200 outputs a low level signal in a normal state, so that the switch transistor is in an turn-off state, and the high level signal output by the power circuit 300 is given to the write protection signal control end of the memory 100, so that the memory 100 is in a write protection state; while the data is to be written to the memory 100, the timing controller 200 outputs a high level signal to control the switch transistor to be turned on, and pulls down the signal level of the write protection signal control end of the memory 100 for removing or releasing the write protection state of the memory 100.

In the present embodiment, when the switch transistor is used for switching control, the switch has a fast response speed, which may avoid protection failure due to response delay. Moreover, since only one switch transistor is used, the circuit structure is simple, and the implementation cost is relatively low compared to the composite switch.

In the present embodiment, the switch transistor may be implemented by using a triode or a MOS transistor, and is not limited thereto. The following is a detailed description of the MOS transistor.

Figure 2:
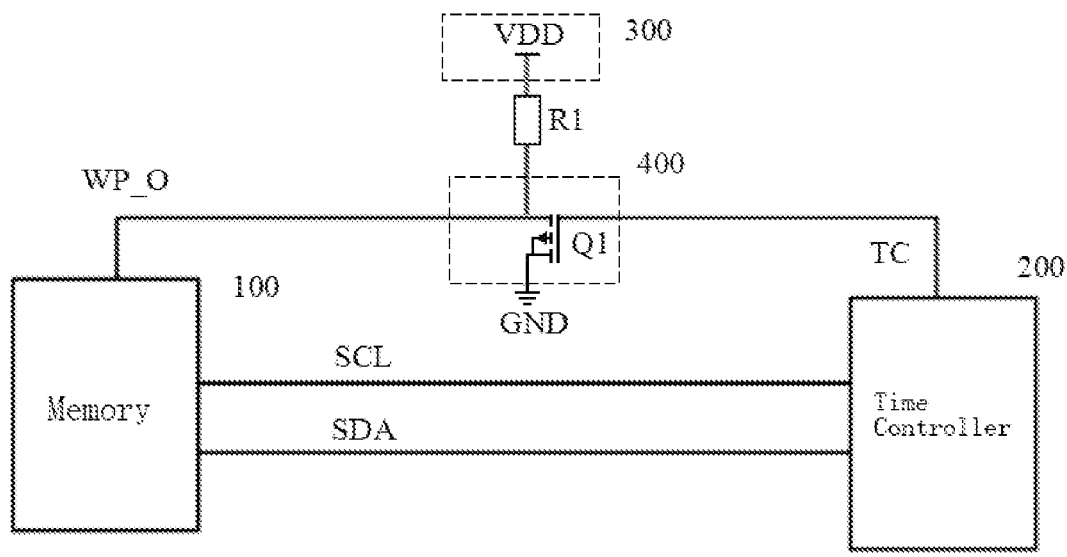
FIG. 2 is a circuit structural view of an embodiment of a protection circuit for a memory in display panel of the present application.

In an embodiment, referring to FIG. 2, the switch transistor is a P-type MOS transistor Q1; a source of the P-type MOS transistor Q1 is the first connection end of the switch transistor, a drain of the P-type MOS transistor Q1 is the second connection end of the switch transistor, and a gate of the P-type MOS transistor Q1 is the controlled end of the switch transistor. The P-type MOS transistor Q1 is turned on when the gate receives a low level signal (corresponding to the turn-on state of the switch transistor), and is turned off when receiving a high level signal. That is, in order to make the memory 100 in the write protection state, the signal TC output from the write control signal output end of the timing controller 200 requires to be configured high to turn off the P-type MOS transistor Q1. If the timing controller 200 is to perform a write operation on the memory 100, the signal TC output from the write control signal output end of the timing controller 200 requires to be configured low to turn on the P-type MOS transistor Q1. When the P-type MOS transistor Q1 is turned off, the high level signal output from the power circuit 300 is supplied to the memory 100, so that the memory 100 is in the write protection state; when the P-type MOS transistor Q1 is turned on, the write protection signal control end WP_O of the memory 100 is grounded, and WP_O is low, and the memory 100 may be written with data.

Figure 3:
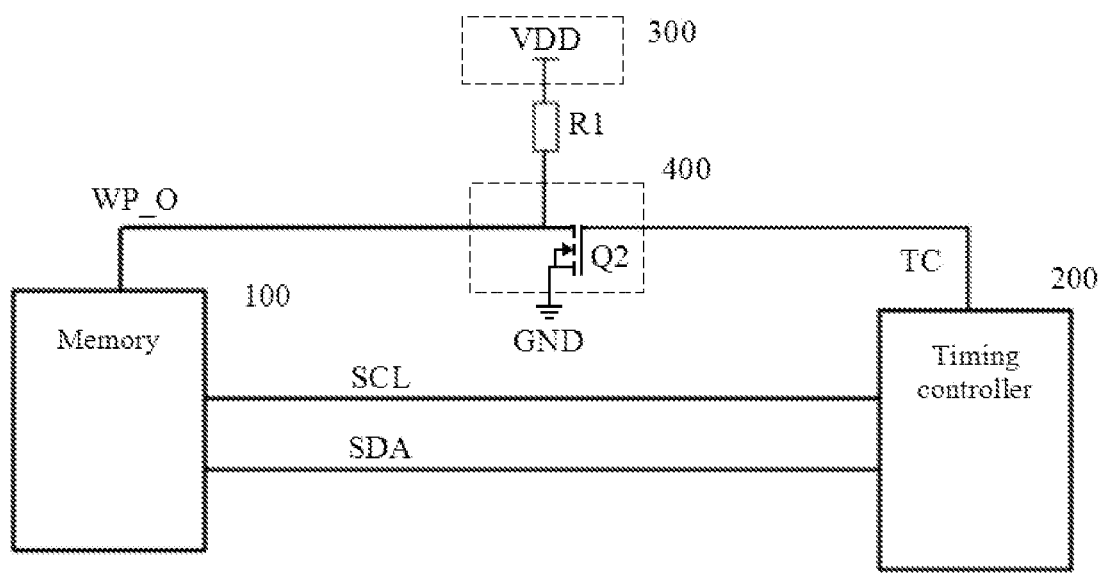
FIG. 3 is a circuit structural view of another embodiment of a protection circuit for a memory in display panel of the present application.

In another embodiment, referring to FIG. 3, the switch transistor is a N-type MOS transistor Q2; a drain of the N-type MOS transistor Q2 is the first connection end of the switch transistor, a source of the N-type MOS transistor Q2 is the second connection end of the switch transistor, and a gate of the N-type MOS transistor Q2 is the controlled end of the switch transistor. The N-type MOS transistor Q2 is turned on when the gate receives a high level signal (corresponding to the turn-on state of the switch transistor), and is turned off when receiving a low level signal. That is, in order to make the memory 100 in the write protection state, the signal TC output from the write control signal output end of the timing controller 200 requires to be configured low to turn off the N-type MOS transistor Q2. If the timing controller 200 is to perform a write operation on the memory 100, the signal TC output from the write control signal output end of the timing controller 200 is configured high to turn on the N-type MOS transistor Q2. When the N-type MOS transistor Q2 is turned off, the high level signal output from the power circuit 300 is supplied to the memory 100, so that the memory 100 is in the write protection state; when the N-type MOS transistor Q2 is turned on, the write protection signal control end WP_O of the memory 100 is grounded, and WP_O is low, and the memory 100 may be written with data.

Further, referring to FIG. 2 or 3 the protection circuit for a memory in display panel further includes a first resistor R1; the first end of the first resistor R1 is connected to the output end of the power circuit 300, and the second end of the first resistor R1 is connected to the input end of the switching circuit 400 and a common end of the write protection signal control end.

In the present embodiment, the power circuit 300 is a DC power supply VDD, and the first resistor R1 is a pull-up resistor of the memory 100, so that when the power signal of the DC power supply VDD is abnormal, the output signal may be clamped to a high level to ensure stable and reliable output, and the write protection signal WP_O is prevented from being invalid.

In the present embodiment, further, the timing controller 200 is further configured to control the switching circuit 400 to be turned off when receiving a feedback signal after the memory 100 completes data writing. When the memory 100 completes the data writing, a feedback or response signal is sent to the timing controller 200, then the timing controller 200 may know that the memory 100 has completed data writing when receiving the feedback or response signal. At this time, the switching circuit 400 is controlled to be turned off, which not only allows the memory 100 to enter the write protection state but also prevents the first resistor R1 from consuming energy. It is understood that due to the existence of the first resistor R1, the energy is consumed by the first resistor R1 if the switching circuit 400 is still turned on after the data is written to the memory 100, causing unnecessary loss. In the present embodiment, after the data is written to the memory 100, the switching circuit 400 is controlled to be turned off, which well avoids this problem.

In addition, the present application further provides a display panel comprising the protection circuit for a memory in display panel described above. It is understood that since the above protection circuit for a memory in display panel is used in the display panel, the embodiment of the display panel includes all the technical solutions of all the embodiments of the protection circuit for a memory in display panel, and the technical effects achieved are also completely the same, so details are not described herein again.

In the present embodiment, the display panel includes, without limitation, a liquid crystal display panel, an organic light-emitting diode or the like, a field emitting display panel, a plasma display panel, and a curved panel, wherein the liquid crystal panel includes a thin film transistor liquid crystal display, a TN panel, a VA panel, an ISP panel, and the like.

In addition, the present application further provides a display device comprising the above display panel, the display panel including the protection circuit for a memory in display panel described above. Therefore, all the technical solutions of all the embodiments of the protection circuit for a memory in display panel are included, and the technical effects achieved are also completely the same, so details are not described herein again. It should be noted that the display device may be a general display or a flat panel TV, and of course, may be a liquid crystal display or a liquid crystal television.

The above mentioned is only the alternative embodiment of the present disclosure, which does not limit the patent scope of the present disclosure, and any equivalent structure transformation made by using the specification and the drawings of the present disclosure or direct/indirect applications in other related technical fields should be contained in the scope of patent protection in a similar way.

What is claimed is:

1. A protection circuit for a memory in display panel, wherein the protection circuit for a memory in display panel comprises:
    a timing controller having a signal transmission end and a write control signal output end;
    a memory having a signal transmission end and a write protection signal control end, the signal transmission end of the memory being connected to the signal transmission end of the timing controller; the memory is configured to store software data of the timing controller;
    a power circuit, an output end of which being connected to the write protection signal control end, the power circuit being configured to output a write protection signal to the memory to limit data of the memory from being overwritten; and
    a switching circuit, an input end of which is interconnected with the output end of the power circuit and the write protection signal control end, an output end of the switching circuit being grounded, a controlled end of the switching circuit being connected to the write control signal output end;
    the timing controller is configured to control the switching circuit to be in a normally turn-off state, and control the switching circuit to be turned on when receiving a data write instruction to the memory.

2. The protection circuit for a memory in display panel according to claim 1, wherein the switching circuit includes a switch transistor; the switch transistor has a first connection end, a second connection end, and a controlled end; the first connection end of the switch transistor is the input end of the switching circuit, the second connection end is the output end of the switching circuit, and the controlled end of the switch transistor is the controlled end of the switching circuit.

3. The protection circuit for a memory in display panel according to claim 2, wherein the switch transistor is a P-type MOS transistor; a source of the P-type MOS transistor is the first connection end of the switch transistor, a drain of the P-type MOS transistor is the second connection end of the switch transistor, and a gate of the P-type MOS transistor is the controlled end of the switch transistor.

4. The protection circuit for a memory in display panel according to claim 2, wherein the switch transistor is a N-type MOS transistor; a drain of the N-type MOS transistor is the first connection end of the switch transistor, a source of the N-type MOS transistor is the second connection end of the switch transistor, and a gate of the N-type MOS transistor is the controlled end of the switch transistor.

5. The protection circuit for a memory in display panel according to claim 1, wherein the protection circuit for a memory in display panel further includes a first resistor; the first end of the first resistor is connected to the output end of the power circuit, and the second end of the first resistor is connected to the input end of the switching circuit and a common end of the write protection signal control end.

6. The protection circuit for a memory in display panel according to claim 5, wherein the timing controller is further configured to control the switching circuit to be turned off when receiving a feedback signal after the memory completes data writing.

7. The protection circuit for a memory in display panel according to claim 1, wherein the memory is an electrically erasable programmable read only memory.

8. The protection circuit for a memory in display panel according to claim 1, wherein the power circuit is a DC power source.

9. A protection circuit for a memory in display panel, wherein the protection circuit for a memory in display panel comprises:
    a timing controller having a signal transmission end and a write control signal output end;
    a memory having a power end, a signal transmission end and a write protection signal control end, the signal transmission end of the memory being connected to the signal transmission end of the timing controller; the memory is configured to store software data of the timing controller;

a power circuit, an output end of which being connected to the write protection signal control end, the power circuit being further connected to the power end of the memory; the power circuit is configured to output a write protection signal to the memory to limit data of the memory from being overwritten; and a switching circuit, an input end of which is interconnected with the output end of the power circuit and the write protection signal control end, an output end of the switching circuit being grounded, a controlled end of the switching circuit being connected to the write control signal output end;

the timing controller is configured to control the switching circuit to be in a normally turn-off state, and control the switching circuit to be turned on when receiving a data write instruction to the memory.

10. A display panel, wherein the display panel comprises a protection circuit for a memory in display panel, the protection circuit for a memory in display panel including:

a timing controller having a signal transmission end and a write control signal output end;

a memory having a signal transmission end and a write protection signal control end, the signal transmission end of the memory being connected to the signal transmission end of the timing controller; the memory is configured to store software data of the timing controller;

a power circuit, an output end of which being connected to the write protection signal control end, the power circuit being configured to output a write protection signal to the memory to limit data of the memory from being overwritten; and a switching circuit, an input end of which is interconnected with the output end of the power circuit and the write protection signal control end, an output end of the switching circuit being grounded, a controlled end of the switching circuit being connected to the write control signal output end;

the timing controller is configured to control the switching circuit to be in a normally turn-off state, and control the switching circuit to be turned on when receiving a data write instruction to the memory.

11. The display panel according to claim 10, wherein the memory also has a power end, and the power circuit is further connected to the power end of the memory.

12. The display panel according to claim 10, wherein the switching circuit includes a switch transistor; the switch transistor has a first connection end, a second connection end, and a controlled end; the first connection end of the switch transistor is the input end of the switching circuit, the second connection end is the output end of the switching circuit, and the controlled end of the switch transistor is the controlled end of the switching circuit.

13. The display panel according to claim 12, wherein the switch transistor is a P-type MOS transistor; a source of the P-type MOS transistor is the first connection end of the switch transistor, a drain of the P-type MOS transistor is the second connection end of the switch transistor, and a gate of the P-type MOS transistor is the controlled end of the switch transistor.

14. The display panel according to claim 12, wherein the switch transistor is a N-type MOS transistor; a drain of the N-type MOS transistor is the first connection end of the switch transistor, a source of the N-type MOS transistor is the second connection end of the switch transistor, and a gate of the N-type MOS transistor is the controlled end of the switch transistor.

15. The display panel according to claim 10, wherein the protection circuit for a memory in display panel further includes a first resistor; the first end of the first resistor is connected to the output end of the power circuit, and the second end of the first resistor is connected to the input end of the switching circuit and a common end of the write protection signal control end.

16. The display panel according to claim 15, wherein the timing controller is further configured to control the switching circuit to be turned off when receiving a feedback signal after the memory completes data writing.

17. The display panel according to claim 10, wherein the memory is an electrically erasable programmable read only memory.

18. The display panel according to claim 10, wherein the power circuit is a DC power source.

19. The display panel according to claim 10, wherein the display panel is a liquid crystal display panel or an organic light emitting diode display panel or a field emitting display panel or a plasma display panel or a curved surface panel.

* * * * *